United States Patent
Plaza et al.

(10) Patent No.: US 8,266,563 B2
(45) Date of Patent: Sep. 11, 2012

(54) MULTI-MODE REDUNDANCY REMOVAL

(75) Inventors: Stephen M. Plaza, Hillsboro, OR (US);
Prashant Saxena, Portland, OR (US);
Pei-Hsin Ho, Portland, OR (US);
Thomas R. Shiple, Lexington, MA (US)

(73) Assignee: Synopsys, Inc., Mountain View, CA (US)

( * ) Notice: Subject to any disclaimer, the term of this patent is extended or adjusted under 35 U.S.C. 154(b) by 336 days.

(21) Appl. No.: 12/625,392

(22) Filed: Nov. 24, 2009

(65) Prior Publication Data

US 2011/0126167 A1 May 26, 2011

(51) Int. Cl.
*G06F 17/50* (2006.01)
(52) U.S. Cl. .................... 716/107; 716/132
(58) Field of Classification Search .................. None
See application file for complete search history.

(56) References Cited

U.S. PATENT DOCUMENTS 4,703,435 A * 10/1987 Darringer et al. ............ 716/103
5,590,050 A * 12/1996 Okuda ........................ 716/103

OTHER PUBLICATIONS

Chang et al., "A New Reasoning Scheme for Efficient Redundancy Addition and Removal," IEEE Trans. on CAD of ICs and Systems, vol. 22, No. 7, Jul. 2003, pp. 945-951.*
Goel, "An Implicit Enumeration Algorithm to Generate Tests for Combinational Logic Circuits," IEEE Trans. on Computers, vol. C-30, Issue 3, Mar. 1981, pp. 215-222.*
Gomes et al., "Algorithm Portfolios," Preprint, Oct. 2000, pp. 1-23.*
Roth et al., "Programmed Algorithms to Computer Tests to Detect and Distinguish Bewteen Failures in Logic Circuits," IEEE Trans. on Electronic Computers, vol. EC-16, No. 5, Oct. 1967, pp. 567-580.*
Henftling et al., "A Single-Path-Oriented Fault-Effect Propagation in Digital Circuits Considering Multiple-Path Sensitization," 1995 IEEE, pp. 304-309.*
Kuehlmann et al., "Robust Boolean Reasoning for Equivalence Checking and Functional Property Verification," IEEE Trans. on CAD of ICs and Systems, vol. 21, No. 12, Dec. 2002, pp. 1377-1394.*
Moskewicz et al., "Chaff: Engineering an Efficient SAT Solver," DAC 2001, pp. 530-535.*
Plaza et al., "Node Mergers in the Presence of Don't Cares," 2007 IEEE, pp. 414-419.*
Marques-Silva et al., "Grasp: A Search Algorithm for Propositional Satisfiability," IEEE Trans. on Computers, vol. 48, No. 5, May 1999, pp. 506-521.*
Wang et al., "REDI: An Efficient Fault Oriented Procedure to Identify Redundant Faults in Combinational Logic Circuits," 2001 IEEE, pp. 370-374.*
Wang et al., "Conflict Driven Techniques for Improving Deterministic Test Pattern Generation," 2002 IEEE, pp. 87-93.*

(Continued)

*Primary Examiner* — Leigh Garbowski
(74) *Attorney, Agent, or Firm* — Bever, Hoffman & Harms, LLP; Jeanette S. Harms

(57) ABSTRACT

A multi-mode redundancy removal method is provided. In this method, after accessing the design, a full-scale redundancy removal using fault simulation can be started. When a predetermined period for performing the full-scale redundancy removal has reached a first cut-off, then the method can determine a location for temporary outputs of the design, create the temporary outputs, and perform a localized redundancy removal up to the temporary outputs. An optimized design based on the full-scale redundancy removal and the localized redundancy removal can be output.

39 Claims, 4 Drawing Sheets

OTHER PUBLICATIONS

Berkelaar et al., "Efficient and Effective Redundancy Removal for Million-Gate Circuits," Proc. of Date 2002, 1 page.*

Menon et al., "Redundancy Removal and Simplification of Combinational Circuits," IEEE VLSI Test Symposium 1992, Paper 14.3, pp. 268-273.*

Kundu, Sandip et al. "A Small Test Generator for Large Designs", International Test Conference, 1992 IEEE, pp. 30-40.

Zhu, Qi et al. "SAT Sweeping with Local Observability Don't-Cares", DAC 2006, Jul. 24-28, 2006, San Francisco, CA, USA, pp. 229-234.

* cited by examiner

MULTI-MODE REDUNDANCY REMOVAL

BACKGROUND OF THE INVENTION

1. Field of the Invention

The present invention relates to redundancy removal and in particular to a multi-mode redundancy removal, which quickly yields optimized results.

2. Related Art

An initial register transfer level (RTL) design for an integrated circuit often has nets and/or logic gates that are redundant. Note that a redundant net can be replaced by a constant or eliminated, whereas a redundant logic gate (logic) can be eliminated. As an example, FIG. 1A illustrates a simple circuit 100 including an AND gate 101 and an OR gate 102. AND gate 101 is coupled to two nets A and B, whereas OR gate 102 is coupled to a net C, which is an output of AND gate 101, and also to the net B. The output of OR gate 102 is coupled to a net D. Note that when signals on nets A and B are equal to one (A=B=1), then C=1. In this case, B=D=1. If A=0 and/or B=0, then C=0. In this case, D=B. Therefore, net C can be characterized as having a stuck-at-0 fault, i.e. C=0.

Because of this fault, an equivalent circuit to that shown in FIG. 1A can be formed by disconnecting net C from OR gate 102 (FIG. 1B) and instead connecting one input of OR gate 102 to ground (FIG. 1C). Using circuit simplification, both AND gate 101 and OR gate 102 can be replaced by a net 103 (FIG. 1D) connecting B and D, i.e. AB+B=B. Therefore, net A, AND gate 101, and OR gate 102 are "redundant" and can be eliminated from the design. Redundancy removal is a term of art referring to the technique that removes redundant logic (in the form of nets or logic gates) from a design.

Notably, even when the initial design has no redundancies, mapping and logic manipulations can introduce logic redundancy. Therefore, redundancy removal optimizations are typically invoked at multiple stages of the design optimization flow. Indeed, identifying and eliminating redundant nets/logic is an essential optimization strategy for decreasing design area, reducing critical path delay, and simplifying circuit testability analysis.

Redundancy removal techniques have been developed in both academia and industry. These techniques generally attempt to identify redundant logic by determining which nets are detectable with a particular input vector. This determination can be done through logic simulation, and then for nets that are still not detected, by a proof engine. As used herein, the proof engine refers to a software tool that can generate patterns to test a design. Exemplary well-known algorithms used by the proof engine can include the D Algorithm, PODEM (path-oriented decision making), or FAN (fan-out oriented). These techniques also generally attempt to improve the search heuristics that affect the performance of the proof engine.

Redundancy reduction is particularly susceptible to increasing design complexity. That is, performing redundancy removal for each net in a complex design can require significant time to analyze. Therefore, performing redundancy removal for complex designs can result in runtime explosion. To mitigate this risk, certain abort precautions can be added. Specifically, when redundancy reduction takes too long, the proof engine can abort its analysis.

To avoid calling the proof engine, some techniques perform dynamic simulation. In this technique, the proof engine attempts to derive a simulation vector that can be applied to the nets in fan-in/fan-out cones of the design with the anticipation that some of those nets are not redundant. Unfortunately, simulation typically entails worst-case quadratic performance because vector simulation requires traversal through the entire set of fan-in/fan-out cones of the design. Additionally, the simulation vector may fail to prove that a net is not redundant.

Other techniques attempt to improve redundancy reduction by partitioning the design or creating logic windows around the net to determine whether that net is redundant. Unfortunately, both partitioning and creating logic windows can result in unacceptable optimization (i.e. quality of result (QoR)) loss.

Therefore, a need arises for an improved redundancy reduction that eliminates the potential of runtime explosion while ensuring acceptable optimization.

SUMMARY OF THE INVENTION

A multi-mode redundancy removal method is provided. This method can achieve significant runtime improvements (e.g. over 50%) for integrated circuit designs where redundancy removal is a significant portion (e.g. over 50%) of overall design optimization runtime, while maintaining quality of result (QoR). This method can be effective on many different types of designs, from large flattened designs to small design-ware components.

In this method, after accessing the design, full-scale redundancy removal with fault simulation (e.g. random fault simulation and dynamic simulation) can be performed. This full-scale redundancy removal attempts to determine the redundancy status for each net analyzed. When a predetermined period for performing the full-scale redundancy removal has reached a first cut-off, then the method can determine a location for temporary outputs of the design for each net not yet analyzed, create the temporary outputs, and perform a localized redundancy removal up to the temporary outputs. The full-scale redundancy removal and the localized redundancy removal optimizes a design, which is then output. When the first cut-off is not reached, then the optimized design based only on the full-scale redundancy removal can be output.

Determining the location for the temporary outputs can include for each net, deriving a fan-out cone using a predetermined logic depth, and then placing the temporary outputs at the edge of that fan-out cone. In one embodiment, for a design having a relatively small number of levels of logic, e.g. less than 50 levels of logic, the predetermined logic depth of the fan-out cone can be 1-5 levels of logic. In another embodiment, for a design having a relatively large number of levels of logic, e.g. more than 50 levels of logic, the predetermined logic depth of the fan-out cone can be up to 10% of a total logic depth. For example, when the total number of logic levels in the design is 200, the predetermined logic depth can be up to 20 levels of logic. Note that a corresponding fan-in cone can be derived to be all of the fan-in logic of the net being analyzed and its respective temporary outputs.

In one embodiment, the method can also include determining whether a predetermined period for performing the full-scale redundancy removal and the localized redundancy removal has reached a second cut-off. When the second cut-off is not reached, then the method can continue to determine the location of and create the temporary outputs for additional nets using the same version of the localized technique (i.e. using the same number of predetermined logic levels for the fan-out cone). When the second cut-off is reached, then the method can include determining whether a predetermined period for performing the full-scale redundancy removal and the localized redundancy removal has reached a third cut-off. When the third cut-off is not reached, then, for each net subsequently analyzed, another algorithm for determining the location for the temporary outputs of the design can be chosen. Specifically, the number of predetermined logic levels in the fan-out cone can be reduced. Once the predetermined number of logic levels is set, then the newly-positioned temporary outputs can be created, and a localized redundancy removal up to those temporary outputs can be performed. In one embodiment, when the third cut-off is reached, then a user notice indicating that the design is an outlier design can be output. In another embodiment, when the third cut-off is reached, then the optimized design can be output. In yet another embodiment, when the second cut-off is reached, then the optimized design can be output. In yet another embodiment, additional cut-offs can be considered after the third cut-off with a different algorithm for determining temporary outputs such that the number of logic levels considered decreases after each successive cut-off is reached.

DETAILED DESCRIPTION OF THE FIGURES

In accordance with one aspect of an improved redundancy removal technique, the portion of the circuit being analyzed can be restricted when the circuit is determined to be an outlier case. Notably, in these outlier cases, substantially all redundancies (typically over 90%) can often be proven by examining only a few downstream logic levels. This localized redundancy removal advantageously eliminates complicated calls to the proof engine. Therefore, compared to conventional redundancy reduction, this localized technique can provide significant runtime improvements while preserving quality of result (QoR).

Figure 1A:
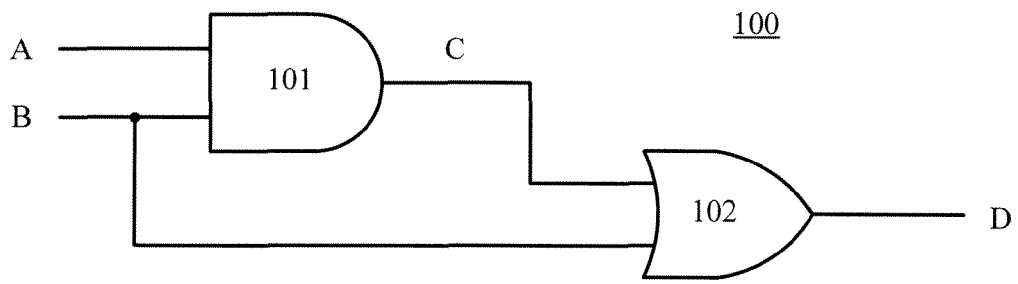
FIGS. 1A-1D illustrate an exemplary redundancy removal and circuit simplification.
Figure 1B:
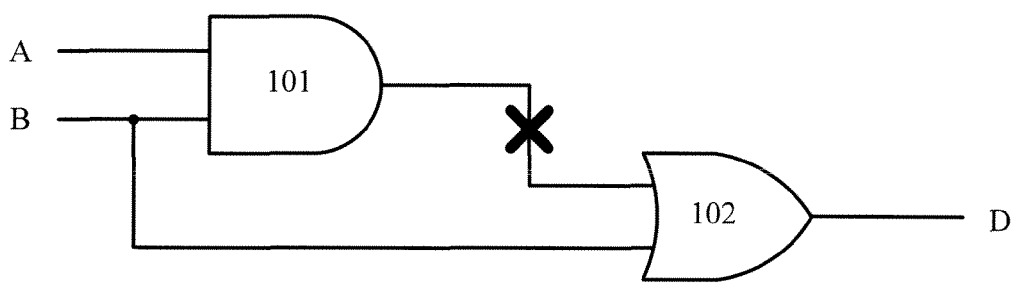
Figure 1C:
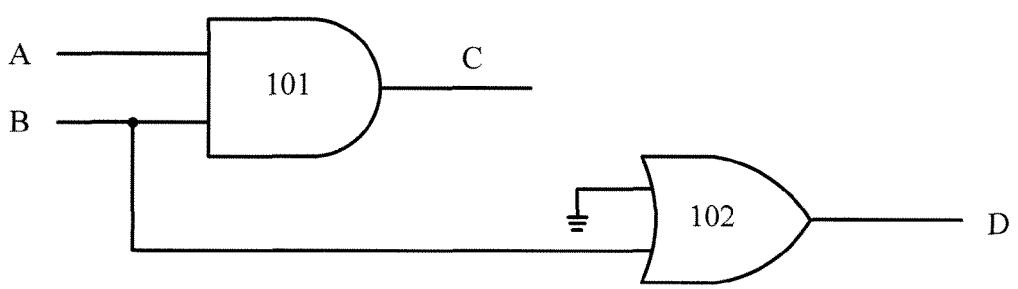
Figure 1D:
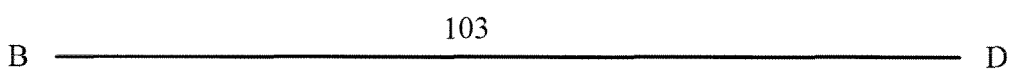
Figure 2:
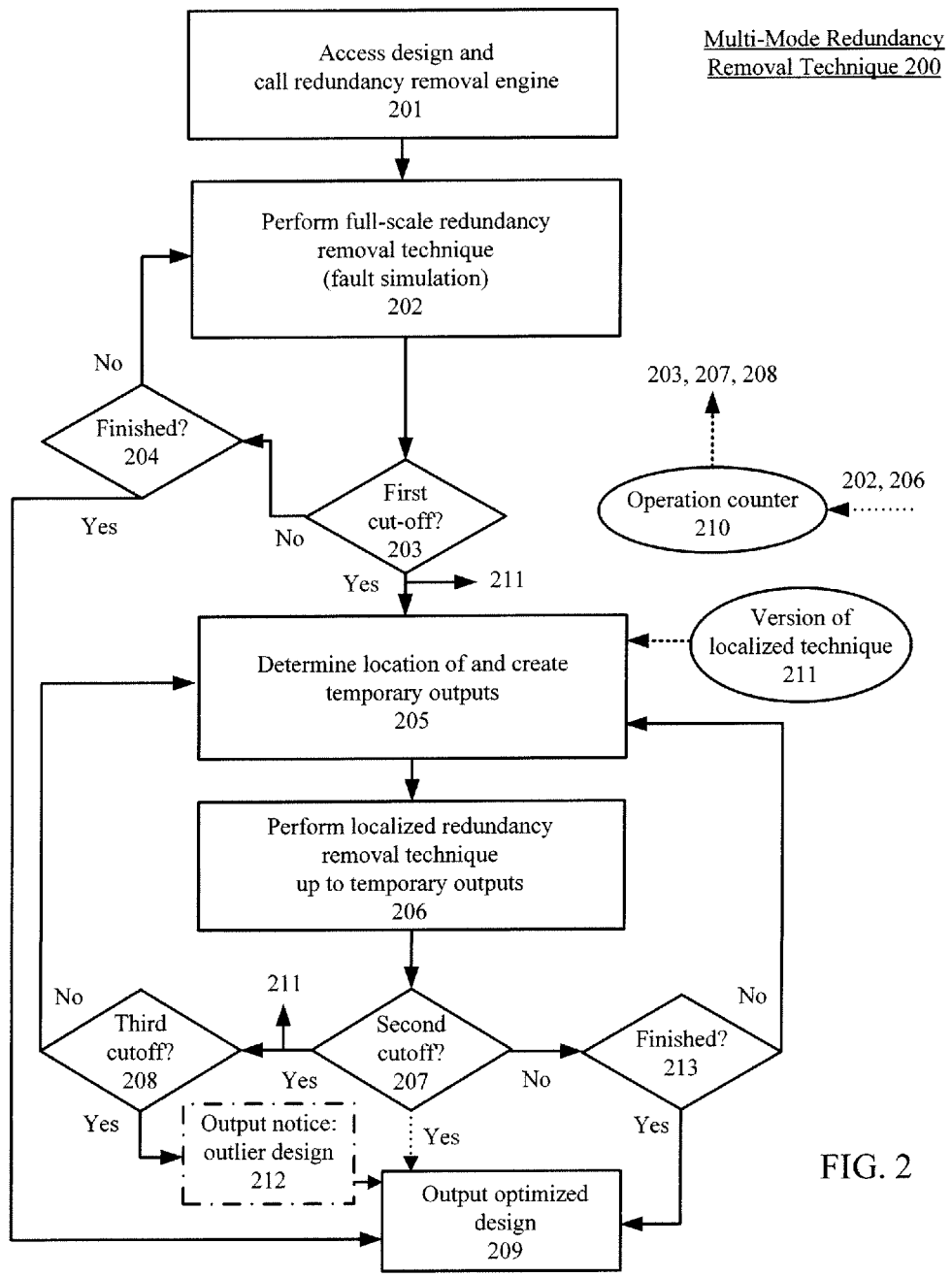
FIG. 2 illustrates an exemplary multi-mode redundancy removal technique.

FIG. 2 illustrates an exemplary multi-mode redundancy removal technique 200. In step 201, the design is accessed and the multi-mode redundancy removal instructions are called. In step 202, a conventional, full-scale redundancy removal technique can be performed on the design. This full-scale redundancy removal attempts to determine the redundancy status for each net analyzed. In one embodiment, this full-scale redundancy removal technique can include random fault simulation and dynamic fault simulation. An exemplary full-scale redundancy removal technique includes ATPG (automatic test pattern generation), which is well known in the art of design testing. Some aspects of a full-scale redundancy removal are discussed below in reference to FIG. 3A.

In accordance with one aspect of an improved, redundancy removal technique, a first cut-off can be defined. This first cut-off can be defined by a predetermined number of operations to be run based on the size of the design, i.e. the larger the design the larger the number of operations associated with the first cut-off. These operations are presumed to approximate a predetermined period of time to run. Therefore, in one embodiment, an operation counter 210 can be used to provide a predetermined period of time to step 203, which determines whether the first cut-off is reached.

If the first cut-off is not reached in step 203, then technique 200 determines whether the analysis of the design is finished in step 204. If not, then the technique returns to step 202. If the first cut-off is reached in step 203, thereby triggering localized redundancy reduction, then the locations of temporary outputs can be determined in step 205. For clarification of step 205, FIGS. 3A and 3B compare fan-in and fan-out cones in a design using a conventional redundancy reduction technique and a localized redundancy reduction technique.

Figure 3A:
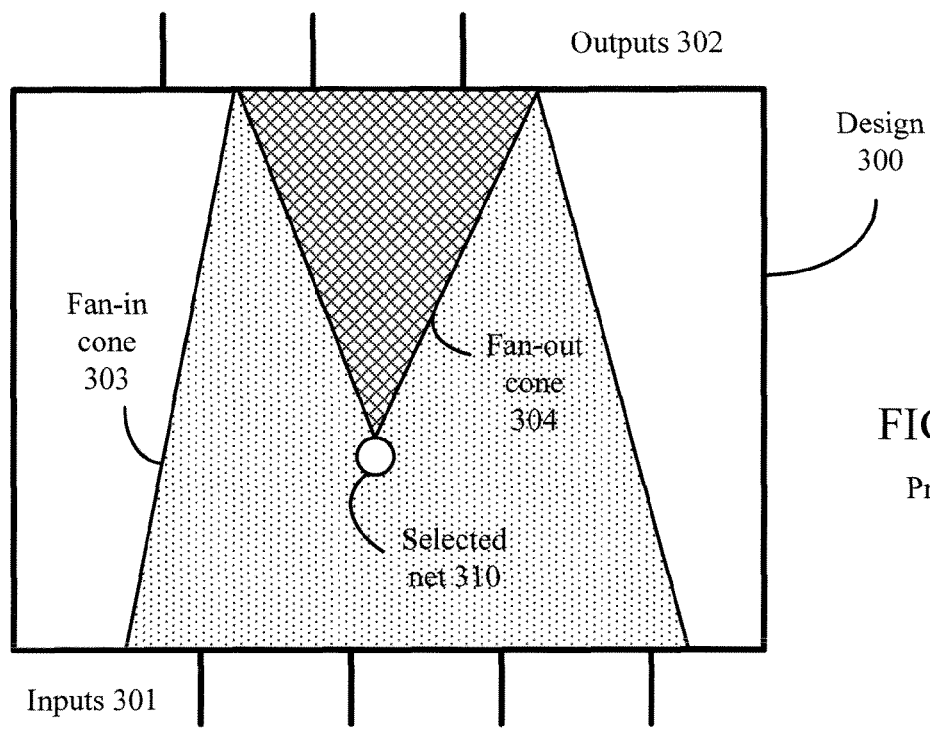
FIGS. 3A and 3B compare the fan-in/fan-out cones for a circuit using conventional redundancy removal and using localized redundancy removal.

Specifically, FIG. 3A illustrates a design 300 (no circuits shown for simplicity) that has primary inputs (e.g. nets) 301 and primary outputs (e.g. nets) 302. In a conventional, full-scale redundancy reduction technique, redundancy reduction is performed on a design using a plurality of the fan-in/fan-out cone sets. An exemplary fan-in/fan-out cone set including a fan-in cone 303 and a fan-out cone 304 is shown in FIG. 3A. In this embodiment, fan-in cone 303 includes four inputs 301 and its associated fan-out cone 304 includes two outputs 302. In a typical complex design, fan-in cone 303 and fan-out cone 304 may include on the order of 40-60 levels of logic.

Note that the sizes of fan-in cone 303 and fan-out cone 304 may differ significantly based on the design. In general, a fan-out cone, in the context of a full-scale redundancy removal, is the set of logic gates that can be reached starting from the net selected for analysis to the primary outputs. Thus, the complexity of the redundancy removal proof engine can be characterized as mostly dependent on the number of logic gates and number of logic levels of the fan-in/fan-out cones, rather than just the number of primary inputs or outputs in the cones.

Figure 3B:
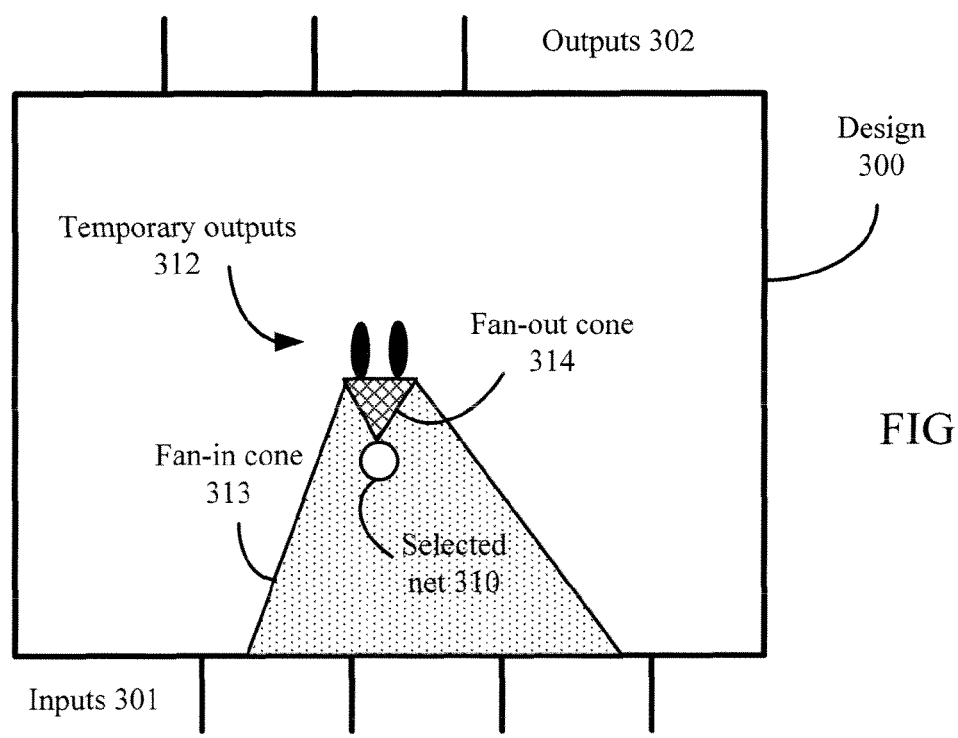

In accordance with a localized redundancy removal technique used with design 300, which is shown in FIG. 3B, the location of temporary outputs 312 can be determined. In one embodiment, based on a given net 310 selected for analysis, the location of temporary outputs 312 can be chosen to minimize the outputs of fan-out cone 314 while containing relatively few levels of downstream logic (compared to the total number of logic levels in the design) because the probability of an input being proved redundant with many outputs is small.

Specifically, the number of levels of logic downstream from selected net 310 can be significantly limited without loss of QoR. Indeed, faults that propagate past the first few downstream levels of logic from selected net 310 typically persist to outputs 302. Therefore, determining the location for temporary outputs 312 can include deriving fan-out cone 314 using a predetermined logic depth, and then placing temporary outputs 312 at the edge of fan-out cone 314. In one embodiment, for a design having a relatively small number of levels of logic, e.g. less than 50 levels of logic, the predetermined logic depth of fan-out cone 314 can be 1-5 levels of logic. In another embodiment, for a design having a relatively large number of levels of logic, e.g. more than 50 levels of logic, the predetermined logic depth of fan-out cone 314 can be up to 10% of a total logic depth. For example, when the total number of logic levels in the design is 200, the predetermined logic depth can be up to 20 levels of logic.

Note that fan-out cone 314 can be significantly smaller than fan-out cone 304. As a result, temporary outputs 312 are thus logically located within fan-out cone 304. After temporary outputs 312 and fan-out cone 314 are created, then fan-in cone 313 can be generated (wherein fan-in cone 313 is also typically much smaller than fan-in cone 303 because the number of nets and logic gates in fan-out cone 314 is much smaller). Note that fan-in cone 313 can be derived to be all of the fan-in logic of net 310 and temporary outputs 312.

In one embodiment, counting the levels of logic can include ignoring buffers. That is, a buffer cannot mask a fault (i.e. the fault cannot persist past the logic gate). In another embodiment, if re-convergence in the design is found, i.e. a fan-in occurs after a fan-out, then the logic between the fan-out and the fan-in can also be ignored for purposes of counting the levels of logic.

Returning back to FIG. 2, note that step 205 can identify nets that were not already analyzed in step 202. Therefore, the optimizations already generated by the conventional redundancy removal technique can be advantageously leveraged during the localized redundancy removal technique (hence, the term "multi-mode" as used herein reflects these dual techniques with one technique leveraging the results of the other technique). In step 206, the proof engine can be run up to the temporary outputs (created in step 205). For example, using FIG. 3B for context, the proof engine can analyze a given net 310 up to temporary outputs 312 of fan-out cone 314 and its corresponding fan-in cone 313. Step 206 can be performed for each net selected (and each associated set of temporary outputs) in step 205. Note that a net can be selected by traversing the design in order. When a net is selected, its corresponding fan-in cone and fan-out cone can be defined.

In one embodiment, a determination of whether a predetermined period for performing the full-scale redundancy removal and the localized redundancy removal has reached a second cut-off can be performed in step 207. Note that the predetermined period set for this second cut-off can also be provided by operation counter 210. In one embodiment, the second cut-off can be set to trade-off between runtime and QoR. In other words, if performing the full-scale redundancy removal and the localized redundancy reduction exceeds a predetermined period set for the second cut-off, then there may be a benefit to choosing a new algorithm for determining the location of the temporary outputs, in particular, reducing the number of predetermined logic levels in the fan-out cone (which can improve redundancy removal runtime at the expense of QoR). Note that reducing the levels of logic in the fan-out cone subsequently reduces levels of logic in the fan-in cone, as described above.

If the second cut-off is not reached in step 207 and the analysis of the design is not finished, as determined in step 213, then the localized redundancy reduction technique can continue by returning to step 205. That is, the location of temporary outputs for additional nets can be determined and the temporary outputs can be created using the same version of localized technique 211 (i.e. using the same number of predetermined logic levels for the fan-out cone)

In one embodiment, if the second cut-off is reached in step 207, then a determination of whether a third cut-off is reached can be performed in step 208. Note that the predetermined period set for this third cut-off can also be provided by operation counter 210. In one embodiment, the third cut-off can be set to a total time allotted for redundancy reduction of the design.

If the third cut-off is not reached, then the flow can return to step 205 to choose another algorithm for determining the location for the temporary outputs, i.e. another version of localized technique 211, to reduce the number of predetermined logic levels in the fan-out cone and, thus, provide a shorter runtime. In other words, when each of first cut-off 203 and second cut-off 207 are reached, that determination can trigger the use of a particular version of the localized redundancy removal technique tool 211, wherein each version can use a predetermined number of levels of logic for the fan-out cone. In one embodiment, the predetermined periods provided by operation counter 210 for cut-offs 203, 207, and 208 can be set by user flags. In another embodiment, the predetermined periods can be values derived from empirically evaluating several designs. In general, the predetermined periods are a function of design size.

An optimized design can be output in step 209. Note that this optimized design may result from only a conventional redundancy removal technique (if finished in step 204) or from the multi-mode redundancy removal technique (if finished in step 213). Further note that when the runtime remains undesirably long, even after using the multi-mode redundancy removal technique (if third cut-off is reached in step 208), then a user notice indicating an outlier design can be output in step 212. Alternatively, step 212 can be skipped and the optimized design can be output in step 209. In another embodiment, when the second cut-off is reached in step 207, the optimized design can be output in step 209. Note that the QoR of the optimized design resulting from steps 204, 213, 207, and 208 differ (i.e. and are ranked from highest QoR to lower QoR). However, notably, even the QoR from step 208 is higher than that achieved by an unfinished full-scale redundancy removal.

As discussed above, operation counter 210 can advantageously determine when redundancy removal runtime is prohibitive by determining the predetermined periods for the first, second, and third cut-offs. Because conventional redundancy removal optimizations for some designs are efficient, first cut-off 203 can efficiently determine "outlier" cases, i.e. those designs that take an inordinate period of time to optimize or simply cannot be optimized. By using cut-offs 203 and 207, the QoR of the multi-mode redundancy removal technique remains high. Moreover, by using cut-off 208, a design that simply cannot be optimized via redundancy removal is quickly identified.

By using the multi-mode redundancy removal technique, substantial runtime improvements, e.g. on the order of 58%, for designs where redundancy removal is a significant fraction of the runtime (e.g. 30% of the runtime) can be achieved. Moreover, the multi-mode redundancy removal technique usually has no negative impact to worst negative slack. Yet further, the multi-mode redundancy removal technique has proven effective on many different types of designs, e.g. on large, flattened designs to small design-ware components.

As described above in reference to step 202, the conventional redundancy removal technique may include dynamic simulation. In this technique, the proof engine attempts to derive a simulation vector that can be applied to the nets in the fan-in/fan-out cones of the design with the anticipation that some of those nets are not redundant. Unfortunately, simulation can entail worst-case quadratic performance because vector simulation requires traversal through the entire set of fan-in/fan-out cones of the design. Additionally, the simulation vector may fail to prove that a net is not redundant. These shortcomings highlight the advantages of using the described multi-mode redundancy reduction technique, which is significantly more efficient than dynamic simulation.

In one embodiment, the multi-mode redundancy removal technique can be used on each hierarchical component before and after technology mapping. In another embodiment, the second cut-off can be replaced with multiple cut-offs. That is, smaller fan-out cones (and corresponding fan-in cones) can be used in progressive iterations of steps 205-207 before reaching step 208, i.e. the third cut-off. For example, in one embodiment, a first iteration of steps 205-207 can use 5 levels of logic in the fan-out cone, a second iteration of steps 205-207 can use 4 levels of logic in the fan-out cone, and a third iteration of steps 205-207 can use 1 level of logic in the fan-out cone.

Figure 4:
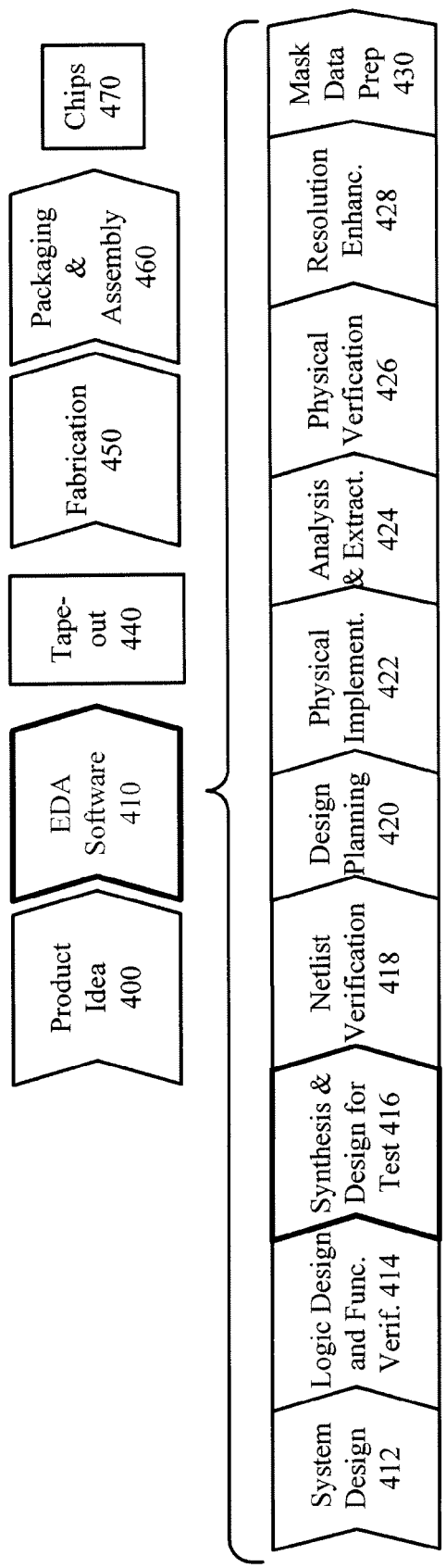
FIG. 4 illustrates a simplified representation of an exemplary digital ASIC design flow.

FIG. 4 shows a simplified representation of an exemplary digital ASIC design flow. At a high level, the process starts with the product idea (step 400) and is realized in an EDA software design process (step 410). When the design is finalized, it can be taped-out (event 440). After tape out, the fabrication process (step 450) and packaging and assembly processes (step 460) occur resulting, ultimately, in finished chips (result 470).

The EDA software design process (step 410) is actually composed of a number of steps 412-430, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 410) will now be provided:

System design (step 412): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 414): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 416): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, Tetramax, and DesignWare® products. The above-described multi-mode redundancy removal technique can be included in step 416.

Netlist verification (step 418): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 420): Here, an overall floorplan for the chip is constructed and analyzed for timing and top-level routing. Exemplary EDA software products from Synopsys, Inc. that can be used at this step include Astro and IC Compiler products.

Physical implementation (step 422): The placement (positioning of circuit elements) and routing (connection of the same) occurs at this step. Exemplary EDA software products from Synopsys, Inc. that can be used at this step include the Astro and IC Compiler products.

Analysis and extraction (step 424): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 426): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 428): This step involves geometric manipulations of the layout to improve manufacturability of the design. Exemplary EDA software products from Synopsys, Inc. that can be used at this step include Proteus, ProteusAF, and PSMGen products.

Mask data preparation (step 430): This step provides the "tape-out" data for production of masks for lithographic use to produce finished chips. Exemplary EDA software products from Synopsys, Inc. that can be used at this step include the CATS(R) family of products.

The above-described multi-mode localized redundancy removal technique can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of microcontrollers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiment. They are not intended to be exhaustive or to limit the invention to the precise forms disclosed. As such, many modifications and variations will be apparent. For example, in one embodiment that is concerned more with speed rather than QoR, the localized redundancy removal can be used without the full-scale redundancy removal. Accordingly, it is intended that the scope of the invention be defined by the following Claims and their equivalents.

The invention claimed is:

1. A method of providing redundancy removal in a design for an integrated circuit, the method comprising:
   accessing the design;
   starting to perform a full-scale redundancy removal;
   determining whether a predetermined period for performing the full-scale redundancy removal has reached a first cut-off;
   using a computer, when the first cut-off has been reached, then determining a location for temporary outputs of the design, creating the temporary outputs, and performing a localized redundancy removal up to the temporary outputs; and
   outputting an optimized design based on the full-scale redundancy removal up to the first cut-off and the localized redundancy removal.

2. The method of claim 1, wherein when the first cut-off is not reached, then outputting the optimized design based only on the full-scale redundancy removal.

3. The method of claim 2, wherein determining the location for the temporary outputs includes:
   determining a number of levels of logic from a selected net for placing the temporary outputs;
   forming a fan-out cone using the selected net and the number of levels of logic;
   locating the temporary outputs at an end of the fan-out cone; and
   forming a fan-in cone using the fan-out cone.

4. The method of claim 3, wherein the number of levels of logic for the fan-out cone is 1-5 levels of logic.

5. The method of claim 3, wherein the number of levels of logic for the fan-out cone is up to 10% of a total number of logic levels in the design.

6. The method of claim 3, wherein the number of levels of logic ignores any buffers.

7. The method of claim 3, wherein the number of levels of logic ignores any re-convergent nets.

8. The method of claim 3, further including:
   determining whether a predetermined period for performing the full-scale redundancy removal and the localized redundancy removal has reached a second cut-off; and
   when the second cut-off is not reached, then continuing to determine the location for the temporary outputs of the design, create the temporary outputs, and perform the localized redundancy removal up to the temporary outputs using a same number of levels of logic for the fan-out cone.

9. The method of claim 8, wherein when the second cut-off is reached, then outputting the optimized design.

10. The method of claim 8, further including:
    when the second cut-off is reached, then determining whether a predetermined period for performing the full-scale redundancy removal and the localized redundancy removal has reached a third cut-off; and
    when the third cut-off is not reached, then determining the location for the temporary outputs of the design using a reduced number of levels of logic for the fan-out cone, creating the temporary outputs using the reduced number of levels of logic for the fan-out cone, and performing the localized redundancy removal up to these temporary outputs.

11. The method of claim 10, further including, when the third cut-off is reached, then outputting a user notice indicating that the design is an outlier design.

12. The method of claim 10, wherein when the third cut-off is reached, then outputting the optimized design.

13. The method of claim 10, further including determining whether a predetermined period for performing the full-scale redundancy removal and the localized redundancy removal has reached at least one more cut-off, wherein for each successive cut-off, the number of levels of logic is reduced.

14. A computer-readable medium storing instructions for providing redundancy removal in a design for an integrated circuit, the instructions, when executed by a processor, performing steps comprising:
    accessing the design;
    starting to perform a full-scale redundancy removal on the design;
    determining whether a predetermined period for performing the full-scale redundancy removal has reached a first cut-off;
    when the first cut-off has been reached, then determining a location for temporary outputs of the design, creating the temporary outputs, and performing a localized redundancy removal up to the temporary outputs; and
    outputting an optimized design based on the full-scale redundancy removal up to the first cut-off and the localized redundancy removal.

15. The computer-readable medium of claim 14, wherein when the first cut-off is not reached, then outputting the optimized design based only on the full-scale redundancy removal.

16. The computer-readable medium of claim 15, wherein determining the location for the temporary outputs includes:
    determining a number of levels of logic from a selected net for placing the temporary outputs;
    forming a fan-out cone using the selected net and the number of levels of logic;
    locating the temporary outputs at an end of the fan-out cone; and
    forming a fan-in cone using the fan-out cone.

17. The computer-readable medium of claim 16, wherein the number of levels of logic for the fan-out cone is 1-5 levels of logic.

18. The computer-readable medium of claim 16, wherein the number of levels of logic for the fan-out cone is up to 10% of a total number of logic levels in the design.

19. The computer-readable medium of claim 16, wherein the number of levels of logic ignores any buffers.

20. The computer-readable medium of claim 16, wherein the number of levels of logic ignores any re-convergent nets.

21. The computer-readable medium of claim 16, further including:
    determining whether a predetermined period for performing the localized redundancy removal has reached a second cut-off; and
    when the second cut-off is not reached, then continuing to determine the location for temporary outputs of the design, create the temporary outputs, and perform the localized redundancy removal up to the temporary outputs using a same number of levels of logic for the fan-out cone.

22. The computer-readable medium of claim 21, wherein when the second cut-off is reached, then outputting the optimized design.

23. The computer-readable medium of claim 21, further including:
    when the second cut-off is reached, then determining whether a predetermined period for performing the full-scale redundancy removal and the localized redundancy removal has reached a third cut-off; and
    when the third cut-off is not reached, then determining the location for the temporary outputs of the design using a reduced number of levels of logic for the fan-out cone, creating the temporary outputs using the reduced number of levels of logic for the fan-out cone, and performing the localized redundancy removal up to these temporary outputs.

24. The computer-readable medium of claim 23, further including, when the third cut-off is reached, then outputting a user notice indicating that the design is an outlier design.

25. The computer-readable medium of claim 23, wherein when the third cut-off is reached, then outputting the optimized design.

26. The computer-readable medium of claim 23, further including determining whether a predetermined period for performing the full-scale redundancy removal and the localized redundancy removal has reached at least one more cut-off, wherein for each successive cut-off, the number of levels of logic is reduced.

27. A synthesis and design for test system including a processor configured with processor-executable instructions for providing redundancy removal in a design for an integrated circuit, the processor-executable instructions performing steps comprising:
   accessing the design;
   starting to perform a full-scale redundancy removal on the design;
   determining whether a predetermined period for performing the full-scale redundancy removal has reached a first cut-off;
   using the processor, when the first cut-off has been reached, then determining a location for temporary outputs of the design, creating the temporary outputs, and performing a localized redundancy removal up to the temporary outputs; and
   outputting an optimized design based on the full-scale redundancy removal up to the first cut-off and the localized redundancy removal.

28. The synthesis and design for test system of claim 27, wherein when the first cut-off is not reached, then outputting the optimized design based only on the full-scale redundancy removal.

29. The synthesis and design for test system of claim 28, wherein determining the location for the temporary outputs includes:
   determining a number of levels of logic from a selected net for placing the temporary outputs;
   forming a fan-out cone using the selected net and the number of levels of logic;
   locating the temporary outputs at an end of the fan-out cone; and
   forming a fan-in cone using the fan-out cone.

30. The synthesis and design for test system of claim 29, wherein the number of levels of logic for the fan-out cone is 1-5 levels of logic.

31. The synthesis and design for test system of claim 29, wherein the number of levels of logic for the fan-out cone is up to 10% of a total number of logic levels in the design.

32. The synthesis and design for test system of claim 29, wherein the number of levels of logic ignores any buffers.

33. The synthesis and design for test system of claim 29, wherein the number of levels of logic ignores any re-convergent nets.

34. The synthesis and design for test system of claim 29, further including:
   determining whether a predetermined period for performing the full-scale redundancy removal and the localized redundancy removal has reached a second cut-off; and
   when the second cut-off is not reached, then continuing to determine the location for temporary outputs of the design, create the temporary outputs, and perform the localized redundancy removal up to the temporary outputs using a same number of levels of logic for the fan-out cone.

35. The synthesis and design for test system of claim 34, wherein when the second cut-off is reached, then outputting the optimized design.

36. The synthesis and design for test system of claim 34, further including:
   when the second cut-off is reached, then determining whether a predetermined period for performing the full-scale redundancy removal and the localized redundancy removal has reached a third cut-off; and
   when the third cut-off is not reached, then determining the location for the temporary outputs of the design using a reduced number of levels of logic for the fan-out cone, creating the temporary outputs using the reduced number of levels of logic for the fan-out cone, and performing the localized redundancy removal up to these temporary outputs.

37. The synthesis and design for test system of claim 36, further including, when the third cut-off is reached, then outputting a user notice indicating that the design is an outlier design.

38. The synthesis and design for test system of claim 36, wherein when the third cut-off is reached, then outputting the optimized design.

39. The synthesis and design for test system of claim 36, further including determining whether a predetermined period for performing the full-scale redundancy removal and the localized redundancy removal has reached at least one more cut-off, wherein for each successive cut-off, the number of levels of logic is reduced.

* * * * *

UNITED STATES PATENT AND TRADEMARK OFFICE
CERTIFICATE OF CORRECTION

PATENT NO. : 8,266,563 B2
APPLICATION NO. : 12/625392
DATED : September 11, 2012
INVENTOR(S) : Stephen M. Plaza et al.

It is certified that error appears in the above-identified patent and that said Letters Patent is hereby corrected as shown below:

Title Page

Item (56) References Cited, OTHER PUBLICATIONS, col. 2, line 2

Roth et al., "Programmed Algorithms to Computer Tests to Detect and Distinguish Bewteen Failures in Logic Circuits," IEEE Trans. on Electronic Computers, vol. EC-16, No. 5, Oct. 1967, pp. 567-580.

to

-- Roth et al., "Programmed Algorithms to Computer Tests to Detect and Distinguish Between Failures in Logic Circuits," IEEE Trans. on Electronic Computers, vol. EC-16, No. 5, Oct. 1967, pp. 567-580. --

Item (56) References Cited, OTHER PUBLICATIONS, (Page 2), line 1

Berkelaar et al., "Efficient and Effective Redundancy Removal for Million-Gate Circuits," Proc. of Date 2002, 1 page.

to

-- Berkelaar et al., "Efficient and Effective Redundancy Removal for Million-Gate Circuits," Proc. of DATE 2002, 1 page. --

Signed and Sealed this
Twenty-fourth Day of June, 2014

Michelle K. Lee
*Deputy Director of the United States Patent and Trademark Office*